United States Patent
Omstead

(10) Patent No.: US 6,713,373 B1
(45) Date of Patent: Mar. 30, 2004

(54) METHOD FOR OBTAINING ADHESION FOR DEVICE MANUFACTURE

(75) Inventor: Thomas R. Omstead, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/211,193

(22) Filed: Aug. 1, 2002

Related U.S. Application Data

(60) Provisional application No. 60/354,437, filed on Feb. 5, 2002.

(51) Int. Cl.[7] .............................................. H01L 21/28
(52) U.S. Cl. ...................... 438/608; 438/650; 438/686; 438/687
(58) Field of Search ................... 438/608, 650, 438/686, 687, FOR 355, FOR 358, FOR 361; 257/623, 753, 762, 773

(56) References Cited

U.S. PATENT DOCUMENTS

| | | | |
|---|---|---|---|
| 4,976,996 A | | 12/1990 | Monkowski et al. |
| 5,770,469 A | | 6/1998 | Uram et al. |
| 5,916,365 A | | 6/1999 | Sherman |
| 5,939,746 A | * | 8/1999 | Koyama et al. |
| 6,107,136 A | * | 8/2000 | Melnick et al. |
| 6,335,241 B1 | * | 1/2002 | Hieda et al. |
| 6,365,502 B1 | * | 4/2002 | Paranjpe et al. |
| 6,368,910 B1 | * | 4/2002 | Sheu et al. |
| 6,432,779 B1 | * | 8/2002 | Hobbs et al. |
| 6,433,379 B1 | * | 8/2002 | Lopatin et al. |
| 6,464,779 B1 | * | 10/2002 | Powell et al. |
| 6,472,322 B2 | * | 10/2002 | Juengling |
| 6,482,740 B2 | * | 11/2002 | Sioninen et al. |
| 2002/0036309 A1 | * | 3/2002 | Sekiguchi et al. |
| 2002/0064592 A1 | * | 5/2002 | Datta et al. |

OTHER PUBLICATIONS

U.S. patent application No. 10/094,308 filed Mar. 7, 2002 with filing receipt.
U.S. patent application No. 10/154,082 filed May 22, 2002 with filing receipt.
U.S. patent application No. 10/215,156 filed Aug. 8, 2002 with Notice of Recordation receipt.
U.S. patent application No. 10/232,445 filed Aug. 28, 2002 with filing receipt.

* cited by examiner

*Primary Examiner*—George Fourson
*Assistant Examiner*—Joannie Adelle García
(74) *Attorney, Agent, or Firm*—Beyer Weaver & Thomas, LLP

(57) ABSTRACT

A method of conductive copper lines in a semiconductor device is provided. A dielectric structure having a surface with recessed features formed therein is provided. A ruthenium oxide layer is deposited over the surface of the dielectric structure. A ruthenium oxide and metallic ruthenium bilayer is formed from the ruthenium oxide layer. Copper conductive lines are formed in the recessed features.

1 Claim, 8 Drawing Sheets

METHOD FOR OBTAINING ADHESION FOR DEVICE MANUFACTURE

CROSS REFERENCE TO RELATED APPLICATIONS

This application claims priority under 35 U.S.C. §119(e), to the Provisional Application No. 60/354,437 entitled "Method for Obtaining Adhesion for Device Manufacture," which was filed on Feb. 5, 2002, and which is incorporated herein by reference for all purposes.

BACKGROUND OF THE INVENTION

This invention pertains to methods for fabricating conductive metal line structures on semiconductor devices. It also pertains to certain metal line structures themselves.

Damascene processes for forming integrated circuit metallization layers employ electroplated copper lines formed in vias and trenches of supporting dielectric layers. Copper atoms are rather mobile and can easily diffuse or migrate into the supporting dielectric and thereby reduce its resistance. To address this problem, Damascene processes employ thin diffusion barrier layers on the entire exposed surface of the dielectric. These barrier layers are made from a material that effectively blocks transport of copper atoms into the adjacent dielectric. Typical barrier layers include refractory metal nitrides such as titanium nitride, tungsten nitride, and tantalum nitride, or sometimes oxides such as ruthenium oxide. These layers are sometimes doped with silicon, carbon, boron, and/or oxygen to increase their diffusion barrier properties.

These diffusion barrier materials are not sufficiently conductive to support direct electroplating of copper from solution. So in a Damascene process one first deposits a thin copper seed layer over the entire exposed diffusion barrier layer. This layer is typically formed by physical vapor deposition (PVD) and has a thickness of approximately 100 to 1,000 angstroms. Onto the seed layer, using the Damascene process one deposits a bulk layer of copper by electroplating. Electroplating fills all vias and trenches and continues until copper covers all exposed dielectric. Finally, the excess copper is removed by chemical mechanical polishing (CMP) to provide a planar surface of exposed copper lines encased by dielectric and diffusion barriers.

As device geometries shrink, the use of physical vapor deposited seed layers becomes less attractive because PVD is a non-conformal process. As such, PVD preferentially deposits copper at the top of a trench or via structure. When the vias and trenches have very narrow openings, a non-conformal deposition can cause the top region of the via or trench to close off before the lower levels completely fill with copper. The result is an unacceptable void space in the deposited copper.

FIG. 1 is a schematic side view of a structure 101 produced by the prior art. A Damascene feature 103 is etched into a dielectric layer 105. A barrier layer 107 is formed over a surface of the dielectric layer 105. A non-conformal copper seed layer 109 is formed over the barrier layer. Such non-conformal seed layers in small diameter features may form a "pinch off" region 111, which may create a void. Although the "pinch off" region 111, as shown, has a slight gap, subsequent deposition of copper may close the "pinch off" region before the part of the feature below the "pinch off" region is filled, creating the void.

Therefore, future generations of device manufacture will likely rely on conformal seed deposition processes such as electroless plating and/or chemical vapor deposition (CVD). Unfortunately, despite considerable effort, it has proved difficult to obtain good adhesion of electroless or CVD copper to typical barrier metals. Further, CVD and electroless films exhibit high contact resistance caused by impurities formed at the interface between the barrier and the copper. This high contact resistance will adversely affect the reliability and performance of the device.

One approach to the problem uses a very thin PVD layer of copper, to provide good adhesion, followed by a thin CVD layer of copper to complete the seed layer. This process still uses PVD. It would be desirable to find a suitable process that employs no PVD copper seed layers.

U.S. Pat. No. 6,365,502 B1, entitled "Microelectronic Interconnect Material with Adhesion Promotion Layer and Fabrication Method", issued Apr. 2, 2002, teaches the use of CVD deposited cobalt or ruthenium to provide an adhesion region on which copper may be deposited by CVD. The adhesion region promotes the adhesion of the CVD copper.

SUMMARY OF THE INVENTION

To achieve the foregoing and in accordance with the purpose of the present invention, a method of conductive copper lines in a semiconductor device is provided. A dielectric structure having a surface with recessed features formed therein is provided. A ruthenium oxide layer is deposited over the surface of the dielectric structure. A bilayer of ruthenium oxide and metallic ruthenium is formed. Copper conductive lines are formed in the recessed features.

In another embodiment of the invention, a structure formed on a semiconductor substrate is provided. A dielectric structure having recessed features is provided. A conformal layer of ruthenium oxide following contours of the recessed features is provided. A layer of metallic ruthenium intimately contacting the conformal layer of ruthenium oxide is provided. A copper layer filling the recessed features is provided.

In another embodiment of the invention, a method of forming conductive copper lines in a semiconductor device is provided. A dielectric structure having a surface with recessed features formed therein is provided. A diffusion barrier layer is formed over the surface of the dielectric structure. A glue layer comprising at least one of metallic cobalt, ruthenium, and iridium is formed. A copper seed layer is conformally deposited on the glue layer by electroless deposition or atomic layer deposition. Copper conductive lines are deposited in the recessed features such that the copper conductive lines are separated from the dielectric structure by at least the diffusion barrier layer and the glue layer.

In another embodiment of the invention, a method of forming conductive copper lines in a semiconductor device is provided. A dielectric structure having a surface with recessed features formed therein is provided. A metal oxide layer is formed over the surface of the dielectric structure. An exposed portion of the metal oxide layer is reduced to a metal to thereby form a bilayer of metal oxide and metal. Copper conductive lines are formed in the recessed features such that the copper conductive lines are separated from the dielectric structure by at least the bilayer of metal oxide and metal.

The detailed description below will further discuss the benefits and features of this invention.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

The present invention pertains to methods and structures employing a ruthenium, iridium and/or cobalt "glue" layer interposed between a diffusion barrier (on a dielectric layer) and a conductive seed layer.

As used herein, "ruthenium" refers to chemically pure elemental ruthenium as well as ruthenium alloys comprised principally of ruthenium. Likewise other glue layer elements, such as "cobalt" refer to the pure elemental form of the element and alloys comprised principally of the element.

Figure 1:
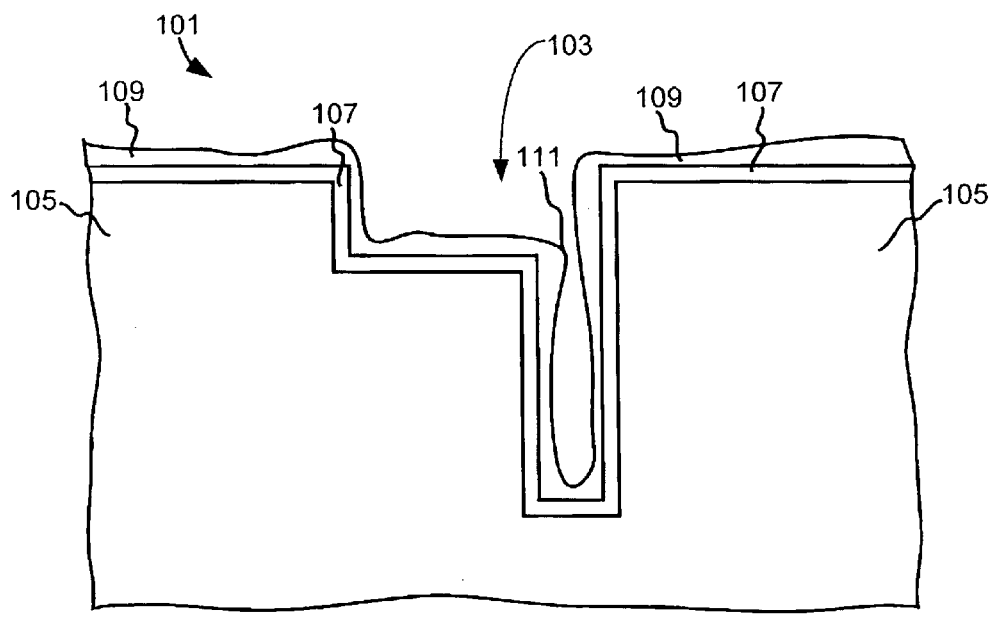
FIG. 1 is a schematic side view of a structure produced by the prior art.
Figure 2:
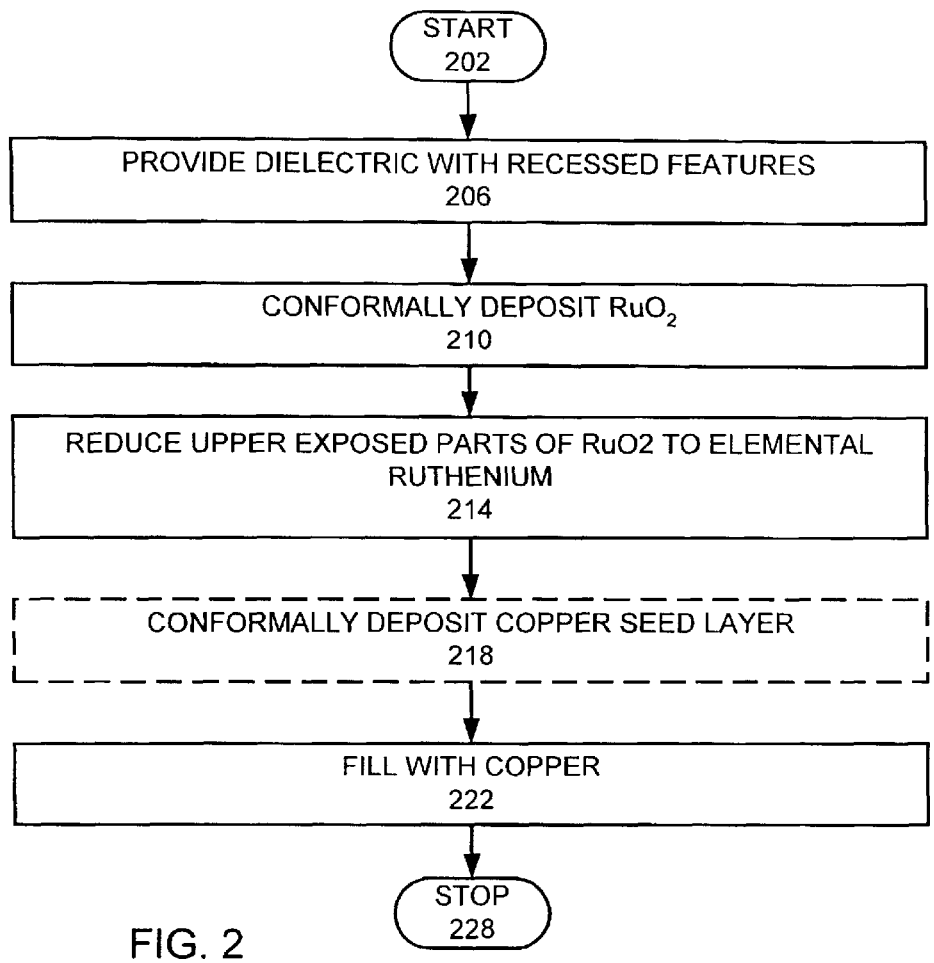
FIG. 2 is a flow chart of a preferred embodiment of the inventive process.
Figure 3:
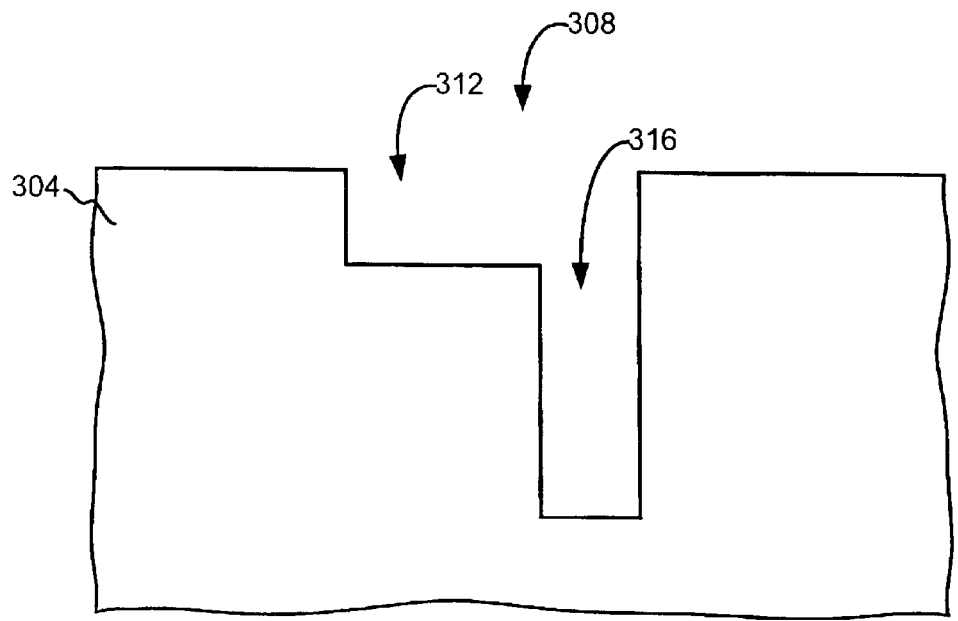
FIG. 3 is a cross-sectional view of a dielectric with a recessed feature.

FIG. 2 is a flow chart of a preferred embodiment of the inventive process. A dielectric is provided with recessed features (step 206). FIG. 3 is a cross-sectional view of a dielectric 304 with a recessed feature 308. In this example, the recessed feature 308 forms a trench 312 and a via 316, which may be used in a copper dual Damascene process. Such features may be etched into the dielectric 304.

Figure 4:
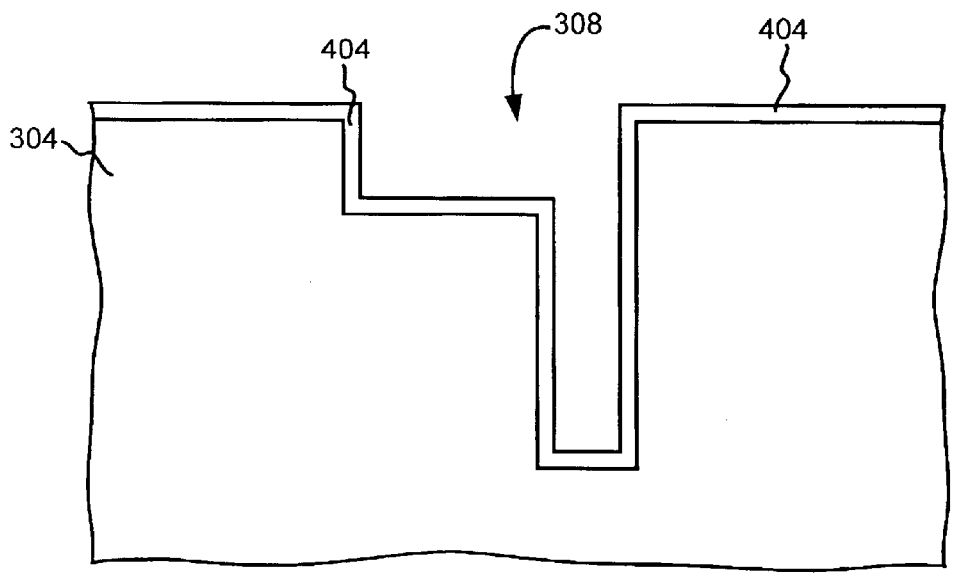
FIG. 4 is a cross-sectional view of the dielectric with a $RuO_x$ layer deposited over a surface of the dielectric, which forms the recessed feature.
Figure 9:
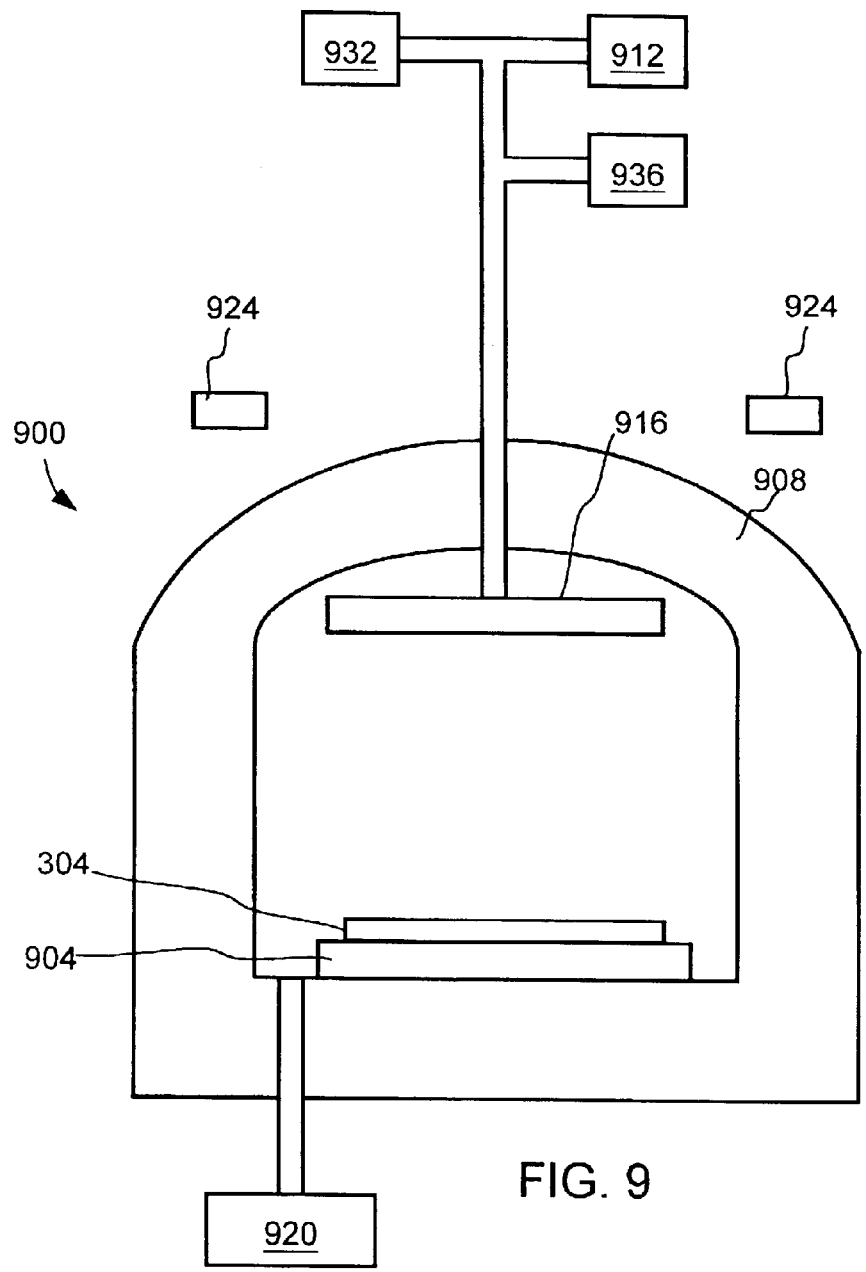
FIG. 9 is a schematic view of a process chamber that may be used to provide the $RuO_x$ layer.

A ruthenium oxide ($RuO_x$, which may be for example $RuO_2$) layer is conformally deposited over a surface of the dielectric (step 210). FIG. 4 is a cross-sectional view of the dielectric 304 with a $RuO_x$ layer 404 deposited over a surface of the dielectric 304, which forms the recessed feature 308. The $RuO_x$ layer may be applied by any conformal process, such as atomic layer deposition (ALD), chemical vapor deposition (CVD), and electroless plating. FIG. 9 is a schematic view of a process chamber 900 that may be used to provide the $RuO_x$ layer. The process chamber 900 may have a support 904, upon which the dielectric structure 304, which is fabricated on a wafer, may be mounted. A chamber wall 908 defines the processing area. $RuO_x$ may be provided by a $RuO_x$ source 912. The $RuO_x$ source may provide $RuO_x$ from a single source or may provide Ru and $O_2$, or other oxygen containing compound, separately from separate sources. The $RuO_x$ flows through a showerhead 916 into the process chamber 900. A vacuum system 920 maintains a desired pressure in the process chamber 900. An electrode 924, which for example may be an inductive or capacitive antenna, may be used to excite the $RuO_x$ to a plasma. Generally, if both a ruthenium precursor and oxygen are introduced at the same time a CVD process is provided. If a ruthenium precursor and oxygen are introduced at different times, so that they do not flow at the same time and are possibly separated by a purge, an ALD process is provided. The energizing electrode may be internal or external. In addition, the showerhead may be RF powered. In the alternative an excited gas, such as ozone, may be used. RF bias and/or heat may be applied in order to enhance the quality of the deposition and/or reduce failure.

Figure 5:
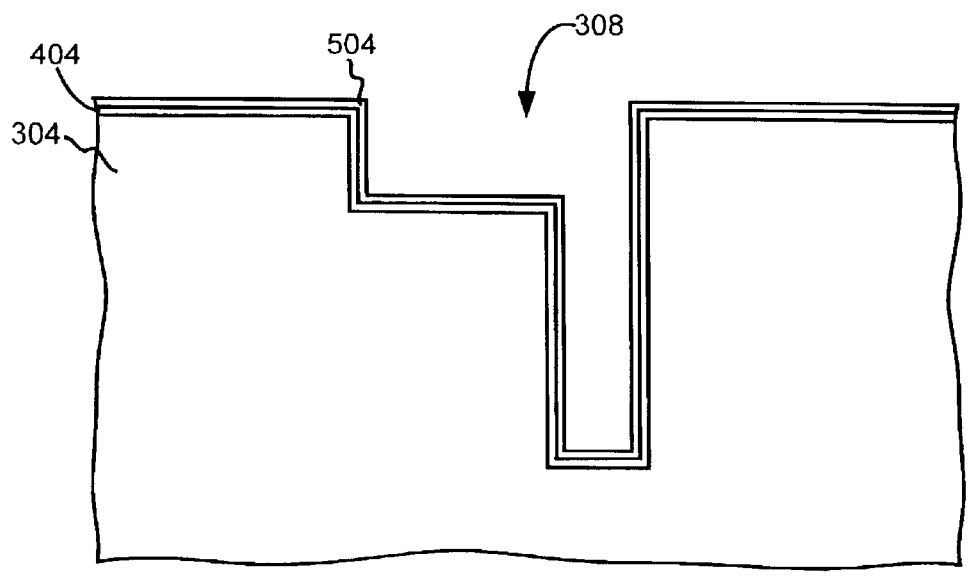
FIG. 5 is a cross-sectional view of the dielectric layer, where part of the $RuO_x$ layer has been reduced to form an elemental ruthenium layer, to form a bilayer of a $RuO_x$ barrier layer and a conductive elemental ruthenium layer.

An elemental ruthenium layer is formed over the $RuO_x$ layer to form a $RuO_x$/Ru bilayer. In this embodiment the upper exposed parts of the $RuO_x$ layer are reduced to elemental ruthenium (step 214). FIG. 5 is a cross-sectional view of the dielectric layer 304, where part of the $RuO_x$ layer has been reduced to form an elemental ruthenium layer 504, to form a bilayer of a $RuO_x$ barrier layer and a conductive elemental ruthenium layer, which may also be used as a "glue" layer. The term "bilayer" refers to two layers, where each layer is of a different composition. In this example, one layer of the bilayer is $RuO_x$ and the second layer of the bilayer is elemental ruthenium. One method of reducing the upper part of the $RuO_x$ layer to form a bilayer is to expose the $RuO_x$ layer to a hydrogen plasma. During such a process, hydrogen gas may be provided from a hydrogen source 932, through the showerhead 916 to the process chamber 900. The electrode 924 may excite the hydrogen to a hydrogen plasma. Other methods, such as using alcohol, a hydrogen gas, a hydrogen plasma, formaldehyde or combinations thereof, may be used to reduce part of the $RuO_x$ layer to form a bilayer. Other reducing agents may be used in other embodiments.

Figure 6:
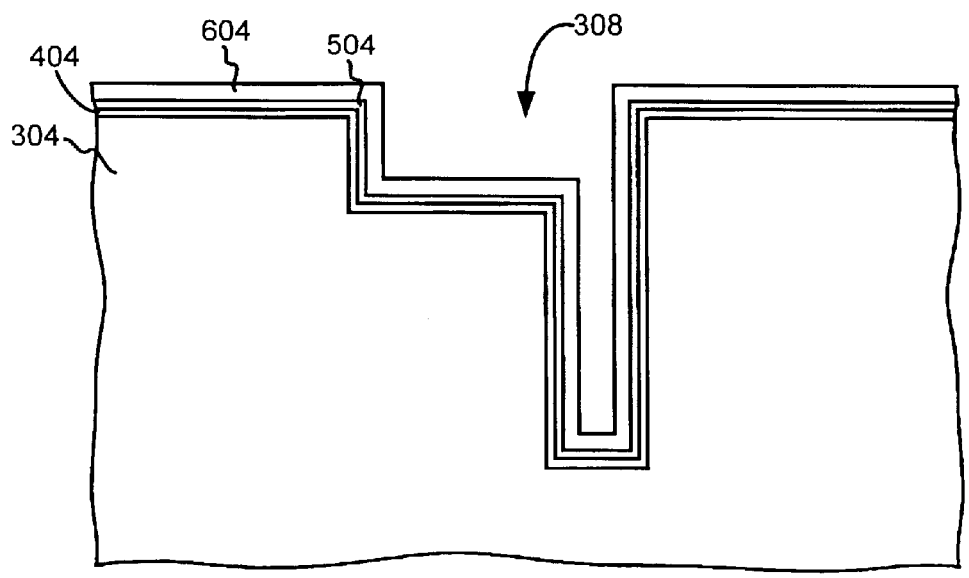
FIG. 6 is a cross-sectional view of a copper seed layer conformally deposited over the elemental ruthenium layer.

In one embodiment of the invention, a copper seed layer is conformally deposited over the elemental ruthenium layer (step 218). FIG. 6 is a cross-sectional view of a copper seed layer 604 conformally deposited over the elemental ruthenium layer 504. The copper seed layer 604 may be conformally deposited through various conformal deposition methods, such as by electroless copper deposition, CVD, and ALD. Copper may be supplied by a copper source 936. The copper supplied by the copper source may be part of a precursor, such as CuXL, where the copper is bonded to a ligand (X), such as HfAc, and a stabilizing Lewis base (L), such as TMVS, COD, or HMY.

Electroless copper deposition has been employed previously as a conformal copper deposition method for various applications. The most frequent industrial application of electroless copper is a formation of thin (100–500 angstroms) conformal copper films within high aspect ratio holes of printed circuit boards to enable subsequent electroplating.

ALD operates by saturating the surface with a single monolayer of chemical species. At certain temperatures, only a monolayer of chemical species will adhere to the substrate surface. Because it operates in a saturation regime, the process is flow and pressure insensitive This allows a simpler and less expensive design of the hardware. This saturation regime is also relatively temperature insensitive, allowing a range of temperatures typically spanning about 25 degrees centigrade, so the temperature control requirements can be eased, thus allowing for a simpler and cheaper temperature control system. An apparatus module that is used for ALD in one application can also be adapted to deposit layers of different thickness in different applications, and even to deposit different materials.

As used herein, the term "monolayer" refers to a quantity of metal atoms (or other chemical entity such as a precursor compound) that fills available sites on a surface. The number of atoms or molecules per unit of surface area is a function of numerous factors such as the physico-chemical properties of available sites, steric features of the atoms/molecules (that might exclude atoms/molecules from adjacent sites), and orientation of atoms/molecules adhered to the surface.

Monolayers are essentially a single layer (or slightly more or less than a single layer) of atoms or chemical molecules on a surface. Such monolayers are thermodynamically distinct from atoms or chemical compounds existing in a bulk state. A further discussion of the concepts of ALD are disclosed in U.S. patent application Ser. No. 09/766,143, entitled "Copper Atomic Layer Chemical Vapor Deposition", by Fair et al. filed Jan. 19, 2001, now U.S. Pat. No. 6,464,779, and U.S. patent application Ser. No. 10/094,308, entitled "Thin Layer Metal Chemical Vapor Deposition", by Fair, filed Mar. 7, 2002, which both are herein incorporated by reference in their entirety for all purposes.

Figure 7:
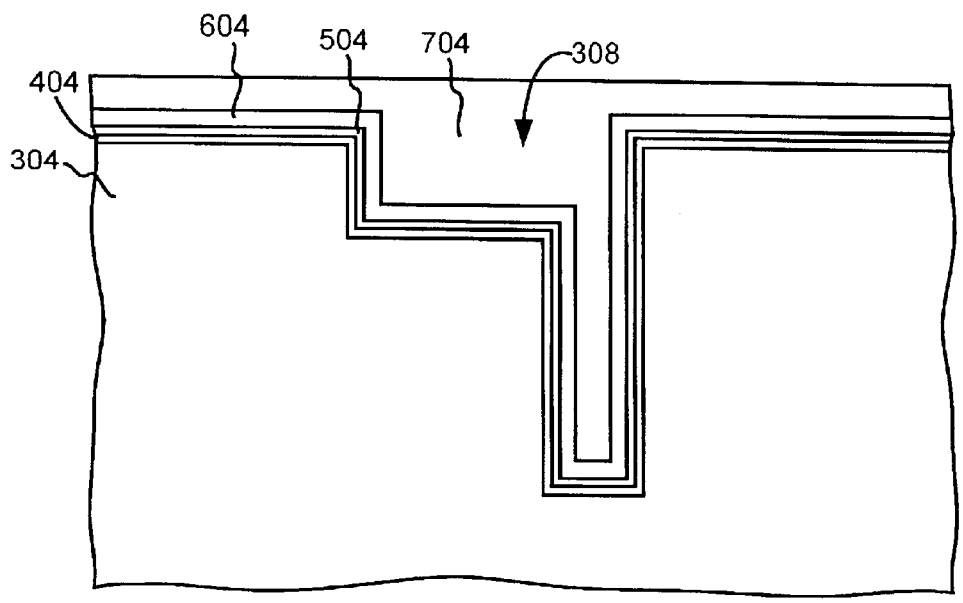
FIG. 7 is a cross-sectional view of a copper filling placed over the copper seed layer to fill the remaining feature.

The remaining recessed feature 308 is then filled with copper (step 222). FIG. 7 is a cross-sectional view of a copper filling 704 placed over the copper seed layer 604 to fill the remaining recessed feature 308. The seed layer 604 may be used as an electrode for electrofilling the feature, which provides the copper filling 704. A chemical mechanical polishing (CMP) may be used to polish the copper fill to the level of the feature.

Figure 8:
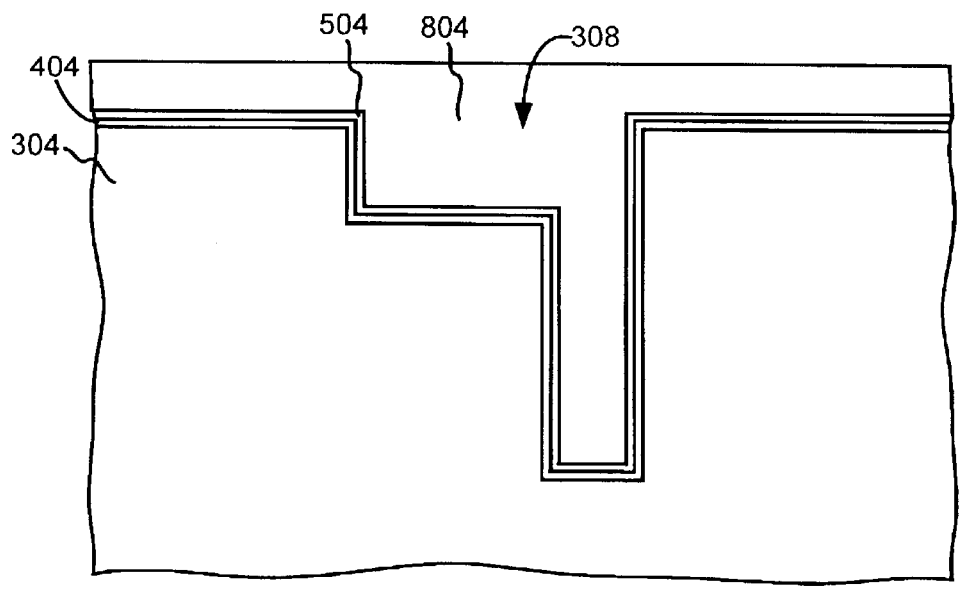
FIG. 8 is a cross-sectional view of a copper filling placed directly over the elemental ruthenium layer.

In an alternative embodiment, the copper seed layer step (step 218) is skipped. The copper filling may be directly placed over the elemental ruthenium layer 504 to fill remaining recessed feature 308. FIG. 8 is a cross-sectional view of a copper filling 804 placed directly over the elemental ruthenium layer 504. The ruthenium layer 504 may be used as an electrode for electrofilling the feature with copper filling 804. In the alternative, a segmented anode, contacts over the face of the wafer, or pulsed plating may be used to electrofill the feature with copper. U.S. patent application Ser. No. 10/154,082, entitled "Method and Apparatus for Uniform Electroplating of Thin Metal Seeded Wafers Using Multiple Segmented Virtual Anode Sources", by Meyer et al., filed May 22, 2002, which is incorporated by reference for all purposes, discloses such an electroplating process, using a segmented anode. U.S. patent application Ser. No. 09/597,848, entitled "Method and Apparatus for Copper Pulse Electroplating", by Mayer et al., filed Jun. 23, 1999, which is incorporated by reference for all purposes, discloses a pulsed plating process. In another embodiment a copper bus as described in U.S. patent application Ser. No. 10/232,445, entitled "Barrier Seed Structures For Integrated Circuit Electroplating", by John Drewrey and Ronald Powell, filed Aug. 28, 2002, which is incorporated by reference for all purposes and U.S. patent application Ser. No. 10/215,156, entitled "Process Scheme For Improving Electroplating Performance In Integrated Circuit Manufacturing", by John Drewery, filed Aug. 8, 2002, which is incorporated by reference for all purposes may be used instead of a conventional copper seed layer. In this embodiment of the invention, such a process may use only the ruthenium layer without a copper seed layer. A chemical mechanical polishing (CMP) may be used to polish the copper fill to the level of the feature. In another alternative, electropolishing or overburden reduction may be used in place of CMP or serially with CMP. In the alternative, a simultaneous CMP and plating process may be performed.

In the preferred embodiment, the bilayer providing a barrier layer and adhesion layer has a thickness of between about 5 angstroms and 200 angstroms. More preferably, the bilayer has a thickness between about 10 angstroms and 50 angstroms. Most preferably, the bilayer has a thickness between about 10 and 30 angstroms.

The use of a bilayer, where a reduction is used to form the bilayer has the advantages of being easier to form. The bilayer provides adhesion to the dielectric through $RuO_x$ and to the copper through Ru.

In an alternative embodiment, a barrier layer may be placed between the dielectric and the $RuO_x$ layer. Such a barrier layer may be tantalum nitride, tungsten nitride, titanium nitride, or some other conventional barrier layer material. Such a barrier layer may be used to protect the dielectric and provide a pore blocking layer. The barrier layer may also entirely replace the use of RuOx in the barrier/adhesion layer stack.

Figure 11:
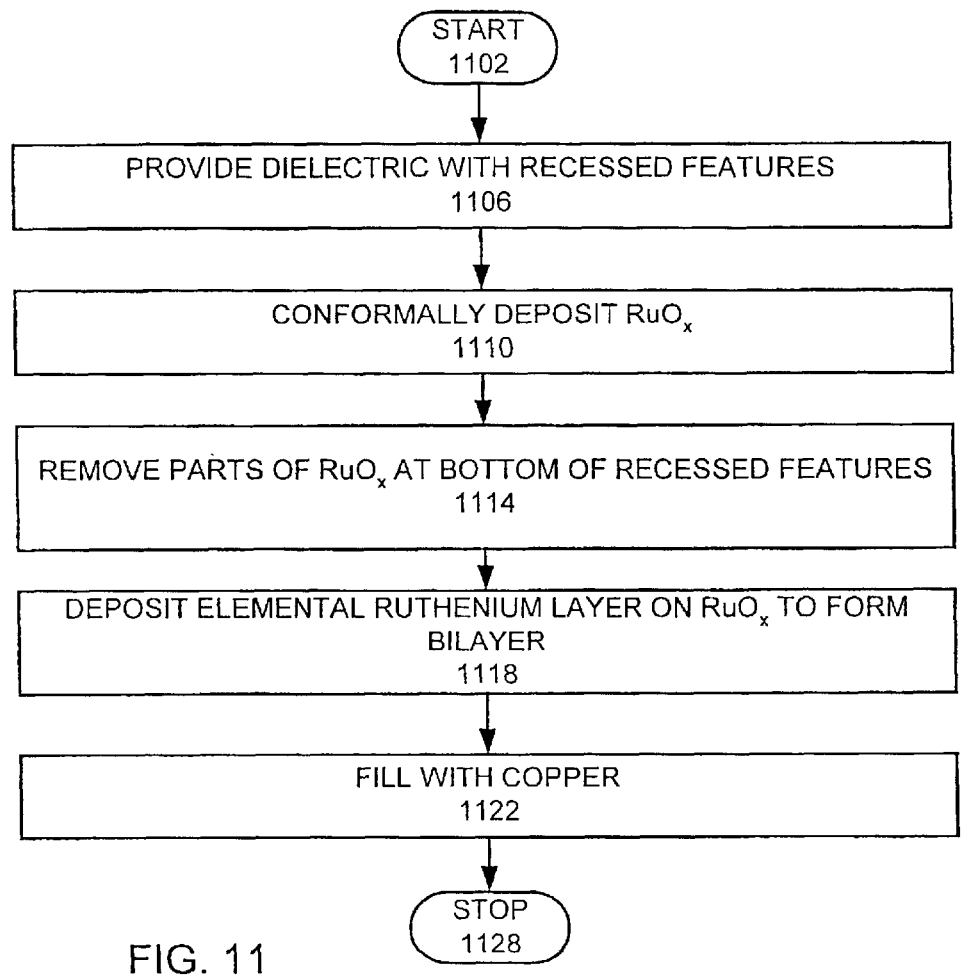
FIG. 11 is a flow chart of another embodiment of the invention.

FIG. 11 is a flow chart of another embodiment of the invention. A dielectric with recessed features is provided (step 1106). A $RuO_x$ layer is conformally deposited (step 1110). Parts of the $RuO_x$ layer at the bottom of the recess features are removed (step 1114). Directional sputtering may be used to remove parts of the $RuO_x$ layer at the bottom of the recess features. An elemental ruthenium layer may be formed over the $RuO_x$ layer by physical layer by physical vapor deposition, atomic layer deposition, chemical vapor deposition, electroless deposition, or electroplating (step 1118). In this embodiment, the $RuO_x$/Ru layers would form a bilayer. The remaining recess may then be filled with copper (step 1122). The removal of the $RuO_x$ from the bottom of the feature helps to clean the feature and reduce contact resistance.

In another embodiment, other conductive metal oxides are used in the place of $RuO_x$. Examples of other metal oxides may be but are not limited to indium tin oxide and fluorine doped tin oxide. In such a case, the metal oxide is later reduced to form a bilayer of the metal oxide and the elemental metal or an alloy thereof.

Figure 10:
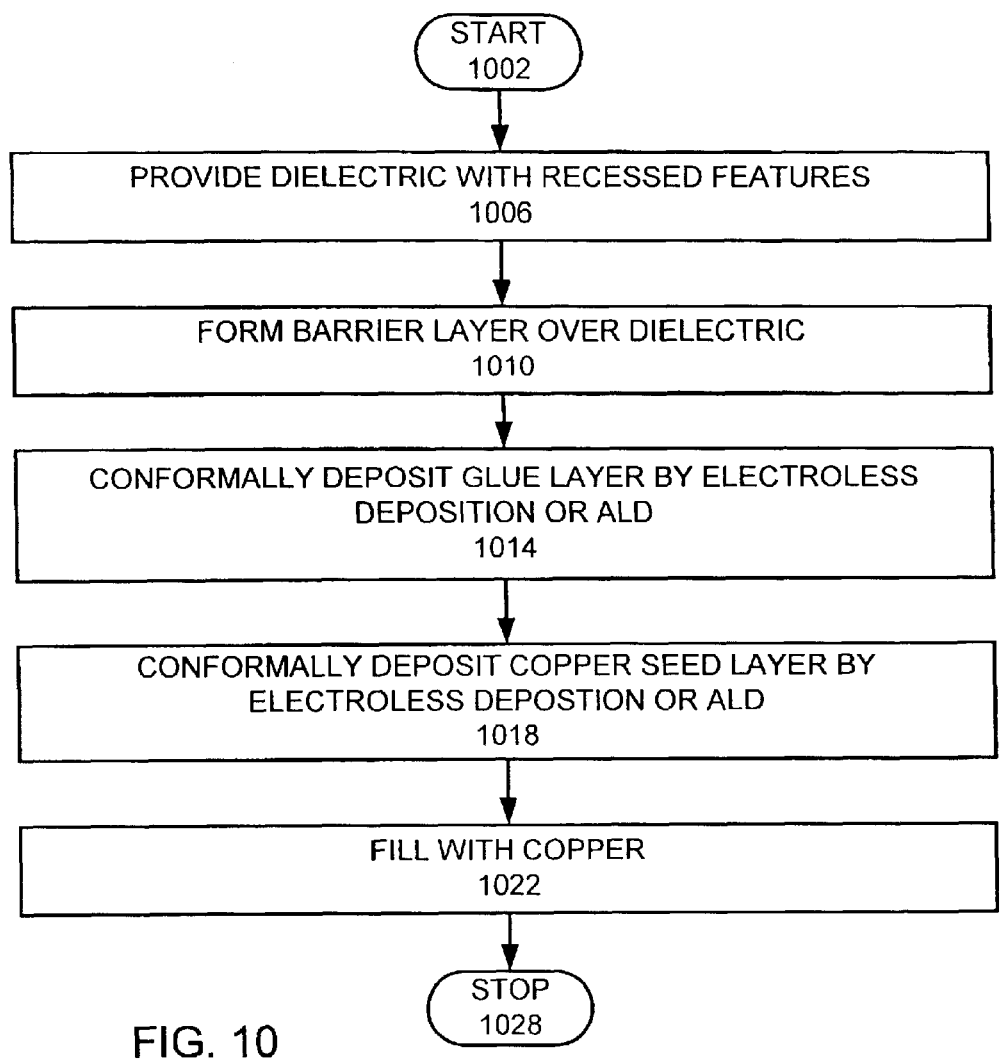
FIG. 10 is a flow chart of a process used in another embodiment of the invention.

FIG. 10 is a flow chart of a process used in another embodiment of the invention. A dielectric is provided with recessed features (step 1006). A barrier layer is formed over a surface of the dielectric with the recessed features (1010). Examples of barrier layer materials include, but are not limited to, tantalum nitride, tungsten nitride, ruthenium oxide, and titanium nitride. The barrier layer is conformally deposited by conformal deposition methods such as CVD, ALD, and electroless deposition. A glue layer is deposited over the barrier layer (step 1014). The glue layer is conformally deposited using either atomic layer deposition or electroless deposition. The glue layer is preferably metallic cobalt, ruthenium, or iridium. A copper seed layer is conformally deposited by either electroless deposition or atomic layer deposition (step 1018). The features are then filled with copper to form copper conductive lines that are separated from the dielectric structure by at least the diffusion barrier layer and the glue layer (step 1022).

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The invention disclosed herein may be practiced without any element, which is not specifically disclosed herein. The use of the singular in the claims does not mean "only one", but rather "one or more", unless otherwise stated in the claims.

What is claimed is:

1. A method of forming conductive copper lines in a semiconductor device, the method comprising:
   (a) providing a dielectric structure having a surface with recessed features formed therein;
   (b) depositing a ruthenium oxide layer over the surface of the dielectric structure;
   (c) forming a bilayer of ruthenium oxide and metallic ruthenium from the ruthenium oxide layer, comprising depositing a layer of metallic ruthenium on the ruthenium oxide layer; and
   (d) forming copper conductive lines in the recessed features.

* * * * *